(12) United States Patent
Mease et al.

(10) Patent No.: US 7,112,084 B1
(45) Date of Patent: Sep. 26, 2006

(54) METHOD AND APPARATUS FOR INSTALLING A PRINTED CIRCUIT ASSEMBLY WITHIN A CHASSIS OF A COMPUTER SYSTEM

(75) Inventors: Keith D. Mease, Gibbstown, NJ (US); Richard Rogala, Phoenixville, PA (US); John Ruscitelli, Broomall, PA (US)

(73) Assignee: Unisys Corporation, Blue Bell, PA (US)

( * ) Notice: Subject to any disclaimer, the term of this patent is extended or adjusted under 35 U.S.C. 154(b) by 295 days.

(21) Appl. No.: 10/389,824

(22) Filed: Mar. 17, 2003

(51) Int. Cl.
*H01R 4/50* (2006.01)

(52) U.S. Cl. .................................. 439/342

(58) Field of Classification Search ............... 439/342, 439/76.1, 377; 361/752, 801
See application file for complete search history.

(56) References Cited

U.S. PATENT DOCUMENTS

| | | | | |
|---|---|---|---|---|
| 3,970,198 A | * | 7/1976 | Prater | 211/41.17 |
| 4,445,740 A | * | 5/1984 | Wallace | 439/152 |
| 4,744,006 A | * | 5/1988 | Duffield | 361/686 |
| 5,205,753 A | * | 4/1993 | Butterfield et al. | 439/157 |
| 5,317,481 A | * | 5/1994 | Hillis et al. | 361/796 |
| 5,657,204 A | * | 8/1997 | Hunt | 361/752 |
| 5,868,585 A | * | 2/1999 | Barthel et al. | 439/377 |
| 5,883,784 A | * | 3/1999 | Hughes et al. | 361/707 |
| 5,967,824 A | * | 10/1999 | Neal et al. | 439/342 |
| 5,980,281 A | * | 11/1999 | Neal et al. | 439/157 |
| 6,033,254 A | * | 3/2000 | Neal et al. | 439/377 |
| 6,115,258 A | * | 9/2000 | Hoyle et al. | 361/752 |
| 6,185,104 B1 | * | 2/2001 | Obermaier | 361/759 |
| 6,195,259 B1 | * | 2/2001 | Whitman et al. | 361/725 |
| 6,224,413 B1 | * | 5/2001 | Lund et al. | 439/342 |

* cited by examiner

*Primary Examiner*—Neil Abrams
(74) *Attorney, Agent, or Firm*—Lise A. Rode; Mark T. Starr; RatnerPrestia

(57) ABSTRACT

A computer system is provided with a chassis at least partially defining an interior and an access opening. The computer system is also provided with an interface connector mounted within or adjacent to the chassis and oriented to face the interior of the chassis. A circuit board assembly is configured for insertion into and removal from the interior of the chassis through the access opening and along an insertion axis, wherein the circuit board assembly has a connector oriented for engagement with the interface connector. The computer system also includes a mounting assembly positioned to facilitate engagement of the connector of the circuit board assembly to the interface connector along a connection access angled with respect to the insertion axis. The mounting assembly has a tray mounted for cam-activated movement with respect to the chassis along the connection axis, wherein the tray is configured with channels to receive rails of the circuit board assembly along the insertion axis and to move the circuit board assembly relative to the chassis along the connection axis to join the circuit board and interface connectors.

18 Claims, 11 Drawing Sheets

METHOD AND APPARATUS FOR INSTALLING A PRINTED CIRCUIT ASSEMBLY WITHIN A CHASSIS OF A COMPUTER SYSTEM

FIELD OF THE INVENTION

This invention relates to a method and apparatus for installing a printed circuit assembly within a chassis of a computer system and, more particularly, a method and apparatus for installing a printed circuit assembly along an insertion axis and along a connection axis angled with respect to the insertion axis.

BACKGROUND OF THE INVENTION

In conventional computer systems, printed circuit boards such as processor circuit board assemblies and memory circuit board assemblies are installed in a computer system for engagement with one or more connectors of a mid plane or back plane. More specifically, such printed circuit boards may have a connector that is oriented along the axis of the insertion of the board, and that connector is mated to a connector of a mid plane or back plane that is also oriented along the axis of insertion.

In such conventional computer systems, the force required to bring about engagement of the connector of the printed circuit board and the connector of the computer is generated along the axis of insertion. This can be accomplished, for example, by manually pushing the printed circuit board in a direction along the axis of insertion as needed to bring about the connection of the respective connectors of the printed circuit board assembly and the back plane or mid plane. Though the insertion force required to make such a connection can be rather significant when connectors are selected that have a large number of pins, such force can generally be generated by manually pushing the printed circuit board into position.

A challenge arises, however, if a computer system were to be configured such that the printed circuit board could not be mated along the insertion axis. In such circumstances, the force generated along the axis of insertion could not be utilized to bring about the mating of connectors along an axis angled with respect to the axis of insertion.

Accordingly, there is a need for a method and apparatus for installing a printed circuit assembly within a chassis of a computer system, wherein that method and apparatus can be utilized for connections made along a connection axis that is angled with respect to the insertion axis.

SUMMARY OF THE INVENTION

According to one aspect of this invention, a computer system is provide with a chassis at least partially defining an interior and an access opening. The computer system is also provided with an interface connector mounted within or adjacent to the chassis and oriented to face the interior of the chassis. A circuit board assembly is configured for insertion into and removal from the interior of the chassis through the access opening and along an insertion axis, wherein the circuit board assembly has a connector oriented for engagement with the interface connector. The computer system also includes a mounting assembly positioned to facilitate engagement of the connector of the circuit board assembly to the interface connector along a connection access angled with respect to the insertion axis. The mounting assembly has a tray mounted for movement with respect to the chassis along the connection axis, wherein the tray is configured to receive the circuit board assembly along the insertion axis and to move the circuit board assembly relative to the chassis along the connection axis.

Accordingly to another exemplary aspect of this invention, a method is provided for installing a printed circuit assembly within a chassis of a computer system. The method includes the step of inserting the printed circuit assembly into an interior of a chassis through an access opening along an insertion axis. The printed circuit assembly is mounted to a tray within the chassis. The tray is moved toward an interface connector along a connection access angled with respect to the insertion axis. A connector of the printed circuit assembly is then urged into engagement with the interface connector by further movement of the tray along the connection axis.

BRIEF DESCRIPTION OF THE DRAWINGS

This invention will be described with reference to the figures, of which.

DETAILED DESCRIPTION OF THE INVENTION

Figure 1:
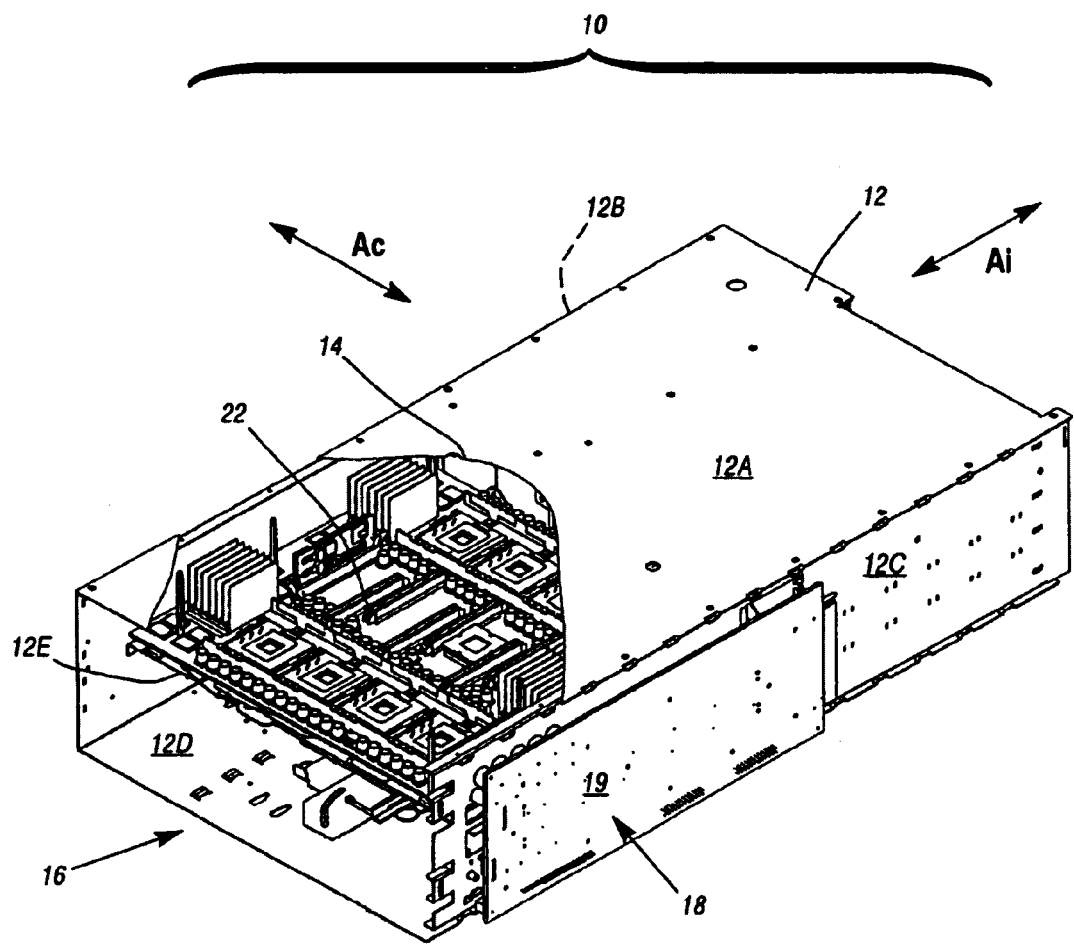
FIG. 1 is a perspective view of an exemplary embodiment of a computer system or computer system subassembly with a portion cut away to reveal internal features thereof.

Various aspects of the invention will now be described with reference to the Figures. It will be appreciated that this invention is not limited in spirit or scope to the embodiments selected for illustration in the Figures. It will also be appreciated that the embodiments shown in the Figures are not rendered to any particular scale or proportion.

Referring generally to the Figures, a computer system or computer system subassembly 10 is configured for installing a printed circuit board assembly within a chassis of a computer system. The connection axis Ac along which the printed circuit board assembly is connected within the computer system is angled with respect to the insertion axis Ai along which the printed circuit board assembly is inserted into the interior of the computer system.

More specifically, the computer system 10 includes a chassis 12 at least partially defining an interior 14 and an access opening 16. An interface connector 20 is mounted within or adjacent the chassis 12 and is oriented to face the interior 14 of the chassis 12. A circuit board assembly 22 is configured for insertion into and removal from the interior 14 of the chassis 12 through the access opening 16 and along an insertion axis Ai, wherein the circuit board assembly 22 has a connector 24 oriented for engagement with the interface connector 20.

A mounting assembly 26 is positioned to facilitate engagement of the connector 24 of the circuit board assembly 22 to the interface connector 20 along a connection axis Ac that is angled with respect to the insertion axis Ai. The mounting assembly 26 has a tray 28 mounted for movement with respect to the chassis 12 along the connection axis Ac. The tray 28 is configured to receive the circuit board assembly 22 along the insertion axis Ai and to move the circuit board assembly 22 relative to the chassis 12 along the connection axis Ac.

The connection axis Ac is substantially perpendicular to the insertion axis Ai in the illustrated embodiments. Though this invention is applicable to computer systems in which the connection axis Ac is at any angle to the insertion axis Ai (including an angle of zero), the problems addressed by this invention are particularly pronounced in computer systems in which the axes Ac and Ai are substantially perpendicular with respect to one another.

The tray 28 can define a channel oriented to slidingly receive the circuit board assembly 22 along the insertion axis Ai. The tray 28 can be optionally provided with flanges 30, which together define the channel for receiving the circuit board assembly 22.

A pin member 32 can extend from either the chassis 12 or the tray 28 to provide for guided movement with respect to a guide surface 34 of the tray 28 or the chassis 12. In one exemplary embodiment, the pin member 32 extends from the chassis 12, and the guide surface 34 is defined by the tray 28. The guide surface 34 can be defined by a slot 36.

The mounting assembly 26 can include a cam mechanism 38 coupled to the tray 28 and configured to move the tray 28 along the connection axis Ac. The cam mechanism 38 can have a cam body 40 that is coupled for movement with respect to the chassis 12. The cam mechanism 38 can also include a cam follower 42 extending from the chassis 12 or the cam body 40 for guided movement with respect to a cam surface 44 of the cam body 40 or the chassis 12. In one exemplary embodiment, the cam follower 42 extends from the chassis 12, and the cam surface 44 is defined by the cam body 40. The cam surface 44 can be defined by a slot 46.

The cam mechanism 38 can also include a cam follower 48 extending from the tray 28 or the cam body 40 for guided movement with respect to a cam surface 50 of the cam body 40 or the tray 28. The cam follower 48 can extend from the tray 28 in one exemplary embodiment, and the cam surface 50 can be defined by is the cam body 40.

The cam mechanism 38 can also include a lever 52 that is coupled for pivotal movement with respect to the chassis 12 and for engagement with the cam body 40 to facilitate movement of the cam body 40 with respect to the chassis 12. A cam follower 54 can extend from the lever 52 or the cam body 40 for guided 20′ movement with respect to a cam surface 56 of the cam body 40 or the lever 52. In one exemplary embodiment, the cam follower 54 extends from the lever 52, and the cam surface 56 is defined by the cam body 40. The cam surface 56 can be defined by a slot 58.

In use, a printed circuit assembly is installed within a chassis of a computer system. More specifically, the printed circuit assembly 22 is inserted into an interior 14 of a chassis 12 through an access opening 16 along an insertion axis Ai. The circuit assembly 22 is mounted to a tray 28 within the chassis 12. The tray 28 is then moved toward an interface connector 20 along a connection axis Ac that is angled with respect to the insertion axis Ai. A connector 24 of the printed circuit assembly 22 is urged into engagement with the interface connector 20 by further movement of the tray 28 along the connection access Ac.

The printed circuit board 22 can be received in a channel of the tray 28 along the insertion axis Ai, and the tray 28 can be moved toward an interface connector 20 along a connection access Ac that is substantially perpendicular to the insertion axis Ai. If the computer system 10 is provided with a cam body 40 that is coupled to the tray 28 and a lever 52 coupled for pivotal movement with respect to the chassis 12 and for engagement with the cam body 40, then the lever 52 can be pivoted with respect to the chassis 12, thereby causing the cam body 40 to move the tray 28 with respect to the chassis 12 along the connection axis Ac.

Referring specifically to FIG. 1, one exemplary embodiment of a computer system or subassembly is designated by the numeral "10." System or subassembly 10 includes a chassis 12 having a top wall 12A, a side wall 12B, an opposite side wall 12C, a bottom wall 12D, and a shelf 12E extending between side walls 12B and 12C. Together, walls 12A–12D of chassis 12 define an interior 14. The interior 14 can be substantially divided into two portions (an upper portion and a lower portion as shown in FIG. 1) by the shelf 12E mounted within the interior 14 of the chassis 12.

The system or subassembly 10 also includes a side plane or interconnect assembly 18 having an interconnect circuit board 19. Though not shown in FIG. 1, interconnect assembly 18 includes an interface connector 20 (FIG. 2) that is mounted on interconnect circuit board 19 for mating and engagement with circuit board assembly 22 by means of a connector 24 (FIG. 2) mounted to the circuit board assembly 22.

Accordingly, and as indicted in FIG. 1 by the arrows, the circuit board assembly 22 is configured to be inserted in the interior 14 of the chassis 12 through the access opening 16 along an insertion axis Ai. Though not shown, the system or subassembly 10 is configured for insertion into a rack such as a standard nineteen inch computer rack along the insertion axis Ai. As such, the front of the rack and the access opening 16 of the system or subassembly 10 correspond to one another in location. Accordingly, access for the insertion of the circuit board assembly 22 may only be available from the front of the system or subassembly 10. Access to the interior 14 of the system or subassembly 10 may not be available from any other location. Also, at least partially to enhance the flow of cooling air through the chassis 12 and along the surfaces of the circuit board or boards therein, the illustrated embodiment of chassis 12 is provided with top and bottom walls 12A and 12B as well as side walls 12B and 12C. Accordingly, the illustrated configuration of chassis 12 prevents or inhibits the insertion of the circuit board assembly 22 into the interior 14 of the chassis 12 from any angle other than generally along the insertion axis Ai.

However, as illustrated in FIG. 1, the connector 24 of the circuit board assembly 22 is to be engaged to an interface connector 20 of a side plane 18 generally along a connection axis Ac. In this embodiment, the connection axis Ac and the insertion Ai are substantially perpendicular to one another. Accordingly, a force should be generated along the connection axis Ac, and substantially perpendicular to the insertion axis Ai, in order to bring about the electrical coupling of the connector 24 of the circuit board assembly 22 to the interface connector 20 of the side plane 18.

Figure 2:
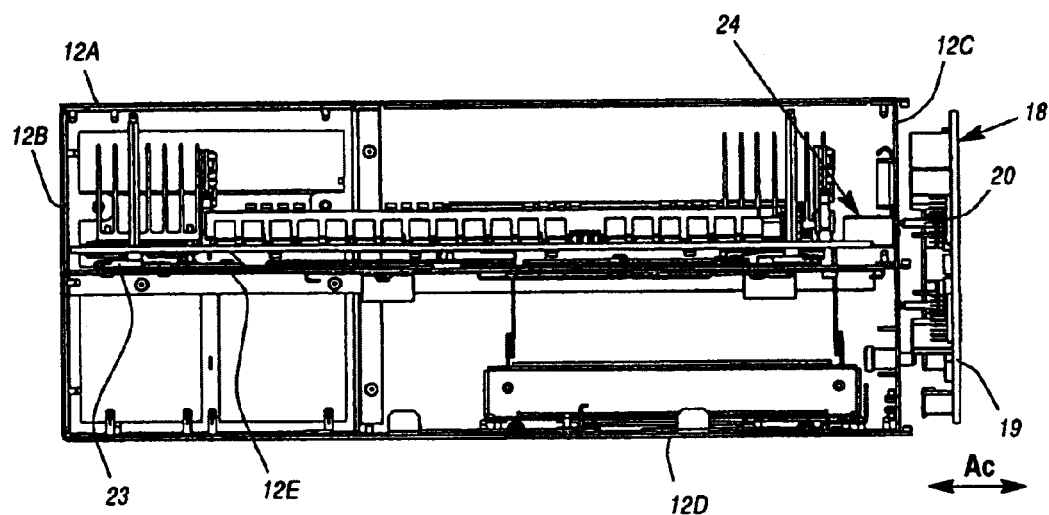
FIG. 2 is a front view of the computer system or computer system subassembly shown in FIG. 1, with a printed circuit board assembly disconnected from an interface connector.
Figure 3:
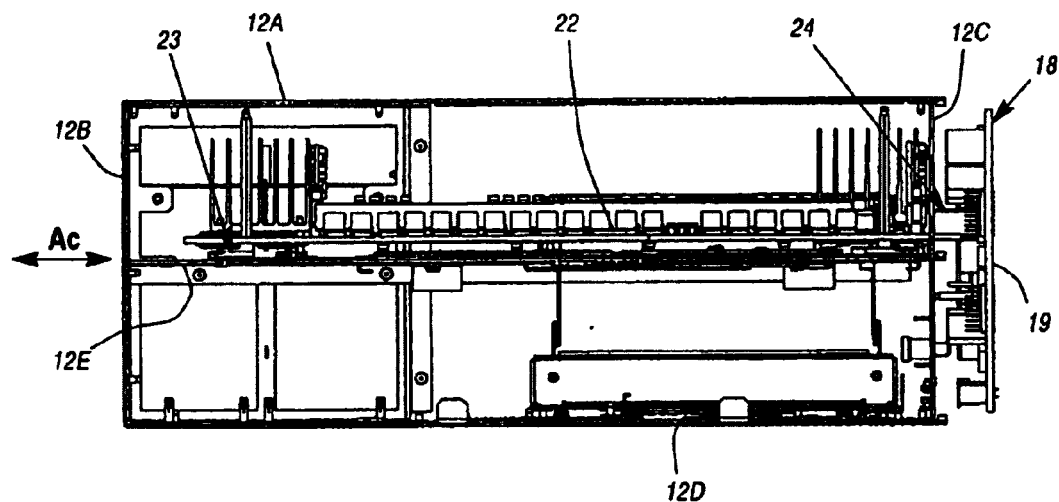
FIG. 3 is a front view of the computer system or computer system subassembly shown in FIG. 1, with the printed circuit board assembly connected to the interface connector.

To further illustrate, reference is made to FIGS. 2 and 3, which show front views of the computer system or subassembly 10 with the circuit board assembly 22 disengaged from the side plane 18 (FIG. 2) and engaged to the side plane 18 (FIG. 3). FIG. 2 illustrates that the circuit board assembly 22 is inserted into the chassis 12 along the insertion axis Ai with the left-hand side (as shown in FIG. 2) proximal to the side wall 12B of the chassis 12, thereby providing clearance between the side wall 12C and the right-hand side of the circuit board assembly 22 (and, more specifically, clearance between the connector 24 of the circuit board assembly 22 and the side wall 12C). Though not shown in the Figures, one or more openings are defined in the side wall 12C of the chassis 12 through which the connector 24 of the circuit board assembly 22 can be extended for engagement to the interface connector 20 of the side plane 18.

Referring now to FIG. 3, which illustrates the circuit board assembly 22 engaged to the side plane 18, it will be noted that there is additional space between the left-hand side of the circuit board assembly 22 and the side wall 12B of the chassis 12. Also, it will be noted that the connector 24 of the circuit board assembly 22 is extended through an aperture (not shown) in the side wall 12C of the chassis 12 to facilitate engagement of the connectors 24 and 20 to one another.

Because the side wall 12D of the chassis 12 does not provide (and instead inhibits) access to the interior 14 of chassis 12 through which the circuit board assembly 22 could be inserted along the connection axis Ac, the force desired to bring about electrical coupling between the connectors 24 and 20 cannot be easily generated. It has been discovered, however, that by using a mounting assembly such as the exemplary mounting assembly 26 illustrated FIGS. 4–7, one may bring about electrical coupling along the connection axis Ac despite the fact that the connection axis Ac is perpendicular to (or at some other angle to) the insertion axis Ai.

Referring now to FIGS. 4–7, an exemplary embodiment of a mounting assembly, designated by the numeral "26," will now be described. Mounting assembly 26 includes a tray 28 mounted for reciprocal movement with respect to the shelf 12E of the chassis 12. The mounting assembly 26 also includes a cam mechanism 38 including a cam body 40 and a lever 52 as will be described in further detail in the following paragraphs.

Actuation of the lever 52 by pivotal movement with respect to the chassis 12 results in movement of the tray 28 toward or away from the connector 20 of the side plane 18 along the connection axis Ac. In other words, actuation of the lever 52 by pivotal rotation with respect to the chassis 12 results in the generation of force along the connection axis Ac. Accordingly, the cam mechanism 38 of the mounting assembly 26 makes it possible to insert a printed circuit board assembly into a chassis along an insertion axis Ai and then make a connection along a connection axis Ac that is angled to (or perpendicular to) the insertion axis Ai.

Figure 8:
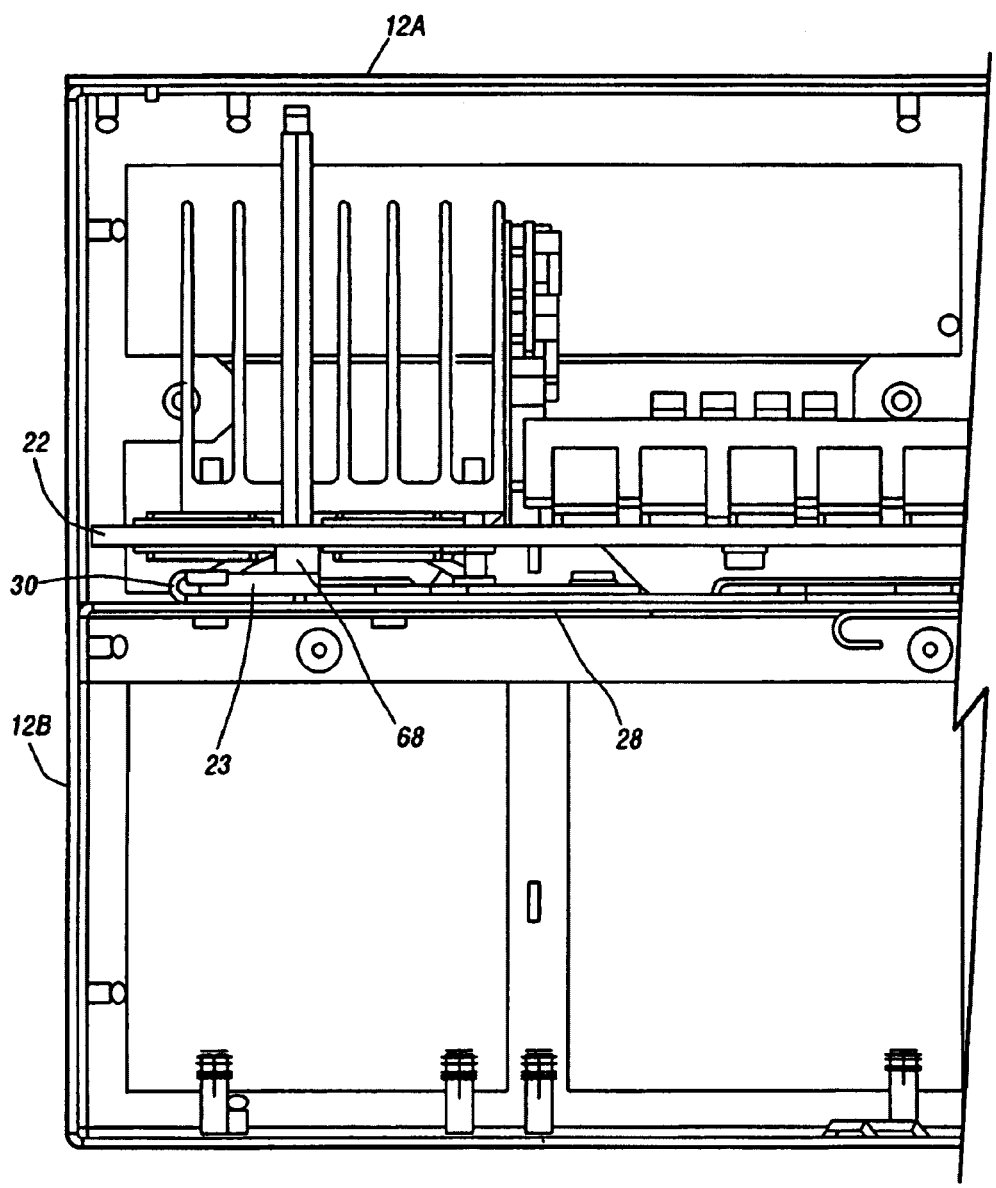
FIG. 8 is a front view of a portion of the computer system or computer system subassembly shown in FIG. 1.
Figure 11:
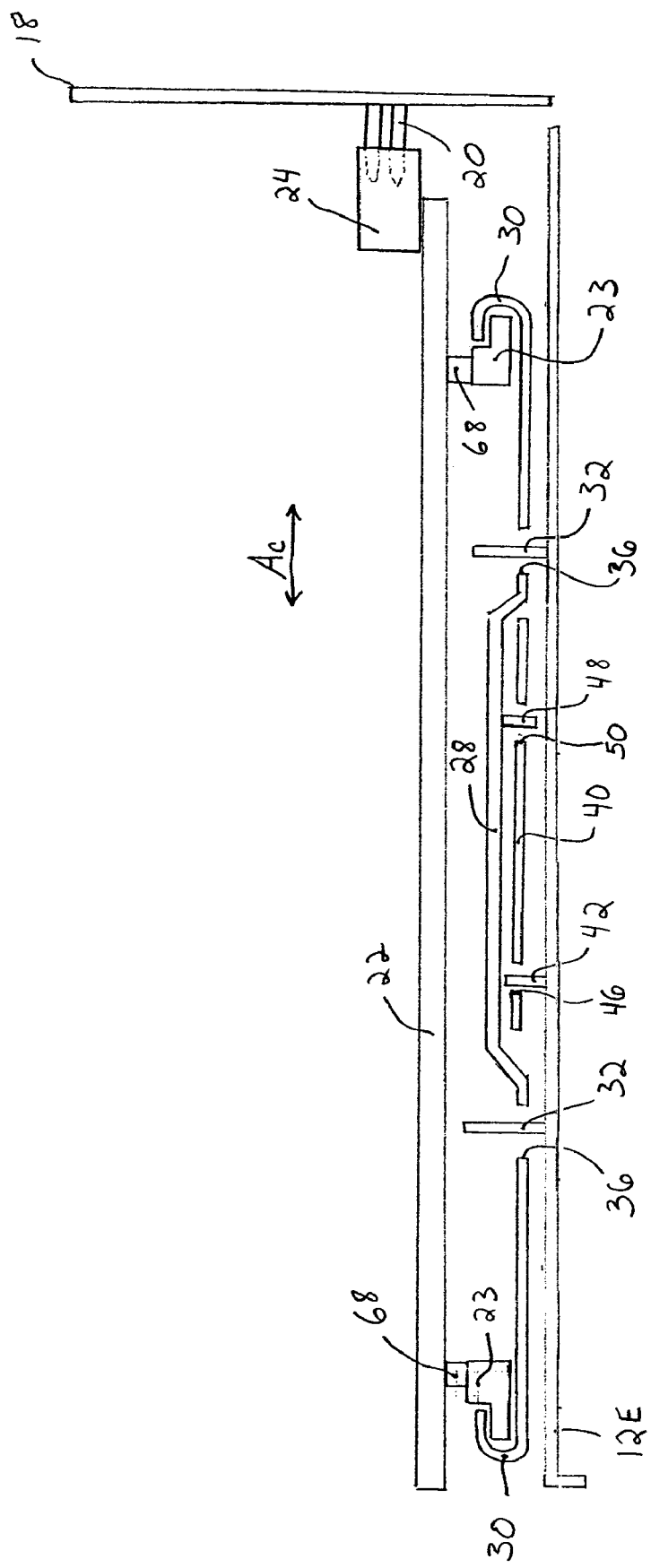
FIG. 11 is a front schematic view of a portion of the computer system or computer system subassembly shown in FIG. 1, with the printed circuit board assembly mounted and connected to the interface connector.

As is best illustrated in FIGS. 2, 8 and 11, the circuit board assembly 22 is provided with a pair of rails 23 that are spaced, aligned, and configured to fit within the channel defined by the flanges 30 of the tray 28. More specifically, generally parallel rails 23, which are oriented in a direction substantially parallel to the insertion axis Ai, are mounted to the underside of the circuit board of the circuit board assembly 22. Mating flanges 30 on the tray 28 also extend substantially parallel to one another and substantially parallel to the insertion axis Ai. The circuit board assembly 22 is therefore engaged by the tray 28 by sliding the rails 23 of the circuit board assembly 22 onto to the tray 28 and within the channel defined by the flanges 30.

According to one exemplary embodiment (illustrated in FIG. 8), the rails 23 are connected to the printed circuit board of the circuit board assembly 22 by conventional fasteners. A spacer such as spacer 68 can be provided to distance the rails 23 from the surface of the circuit board to provide clearance between the circuit board and the tray 28 of the mounting assembly 26.

The shelf 12E of the chassis 12 is provided with pin members 32 (four shown in this embodiment), which extend upwardly for engagement with guide surfaces 34 of slots 36 formed in the moving tray 28. The slots 36 and the respective guide surfaces 34 guide the tray 28 for movement along the connection axis Ac and prevent movement along the insertion axis Ai. Accordingly, by cooperation between the pin members 32 of the chassis 12 and the guide surfaces 34 in the slots 36 of the moving tray 28, the moving tray 28 is limited in its movement to sliding movement in the general direction of the connection axis Ac.

Figure 4:
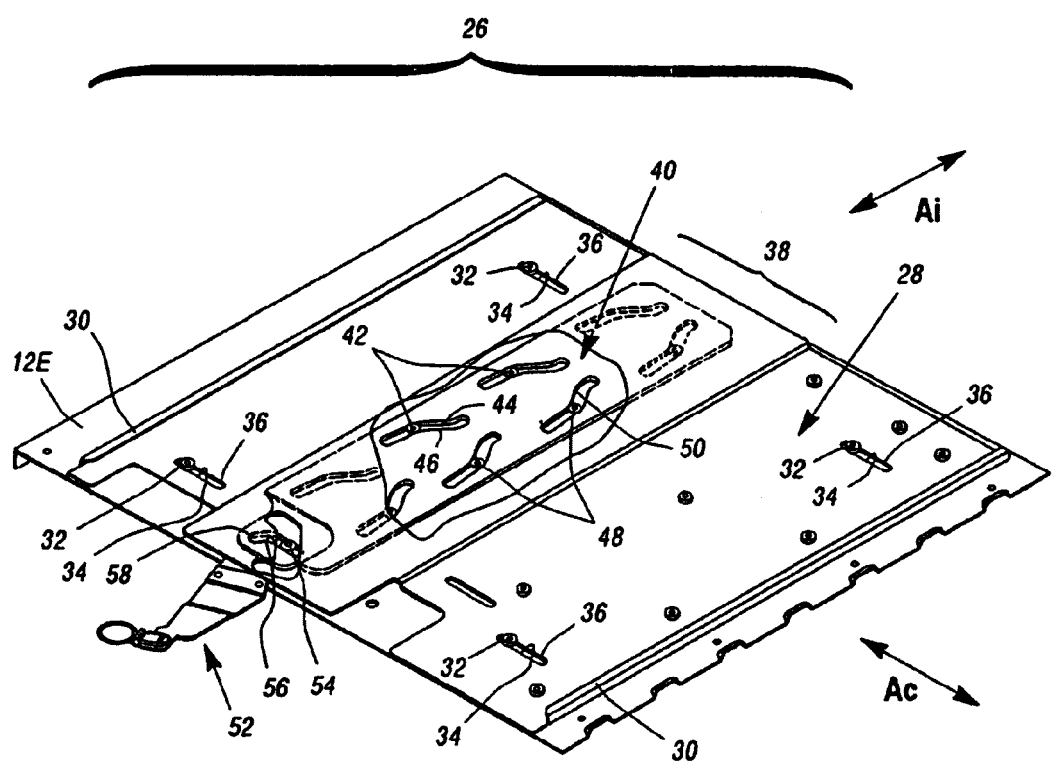
FIG. 4 is a perspective view of an exemplary embodiment of a mounting assembly according to aspects of this invention.

The cam mechanism 38 is provided with cam body 40 in order to translate the pivotal movement of the lever 52 into axial movement of the tray 28 along the connection axis Ac. In order to control the relative movement between the cam body 40 and the chassis 12 (specifically the shelf 12E), the shelf 12E is provided with plural cam followers 42 which are engaged along cam surfaces 44 of slots 46 formed in the cam body 40. The provision of plural cam followers 42 and cam surfaces 44 helps to distribute the force transmitted between the cam body 40 and the shelf 12E more evenly. Although four such slots 46 are illustrated in FIG. 4, it will be appreciated that any number of slots 46 (one or more) can be provided.

In order to transfer forces from the cam body 40 to the tray 28, plural cam followers 48 on the tray 28 are engaged in cam surfaces 50 in slots of the cam body 40. Accordingly, movement of the cam body 40, by virtue of the pivotal movement of the lever 52 with respect to the chassis 12, translates force from the cam body 40, through the cam followers 48, and to the tray 28, thereby causing movement of the tray 28 along the connection axis Ac.

Figure 6:
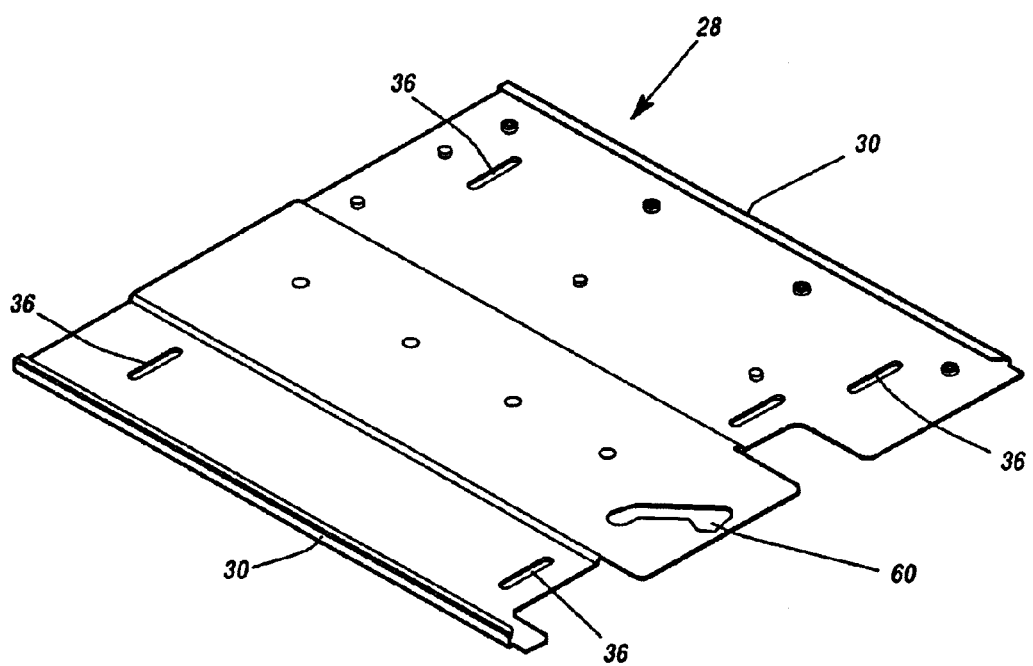
FIG. 6 is a perspective view of an exemplary embodiment of a tray component of the mounting assembly shown in FIG. 4.

The lever 52 also includes a cam follower 54 for engagement with a cam surface 56 defined by a slot 58 in the cam body 40. As is best shown in FIG. 6, a clearance opening 60 is provided in the tray 28 to prevent interference between the cam follower 54 of the lever 52 and the tray 28 as the lever 52 is rotated or pivoted with respect to the shelf 12E of the chassis 12.

Figure 9:
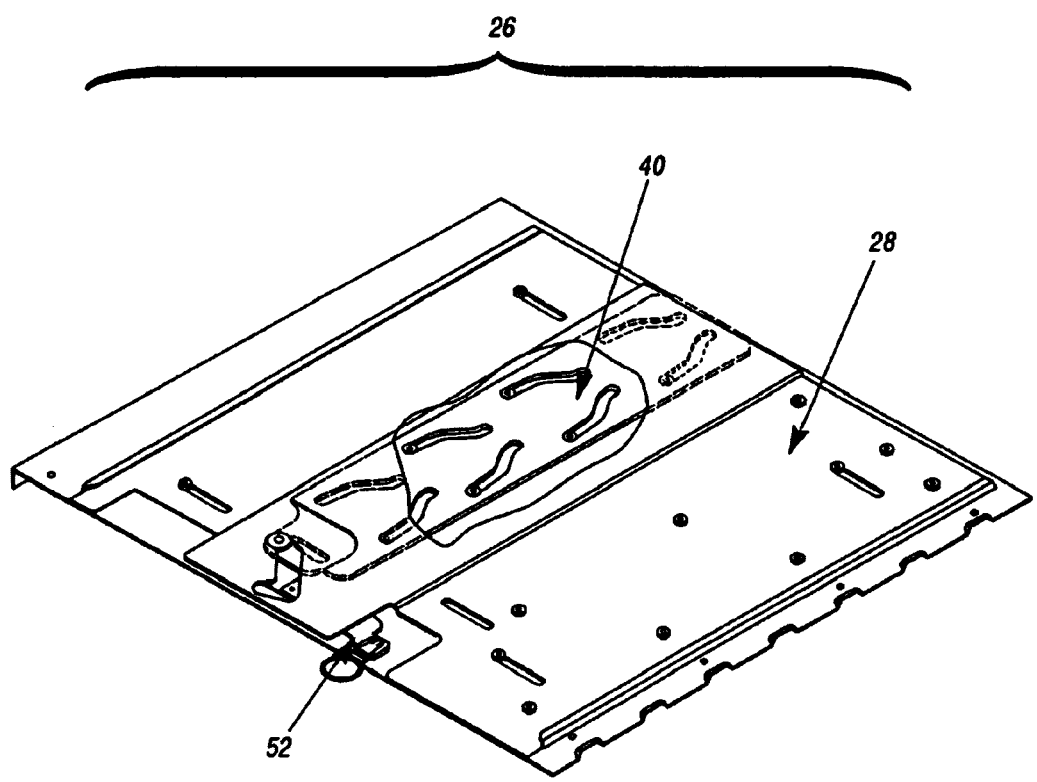
FIG. 9 is a perspective view of the mounting assembly shown in FIG. 4, in the inserted position.
Figure 10:
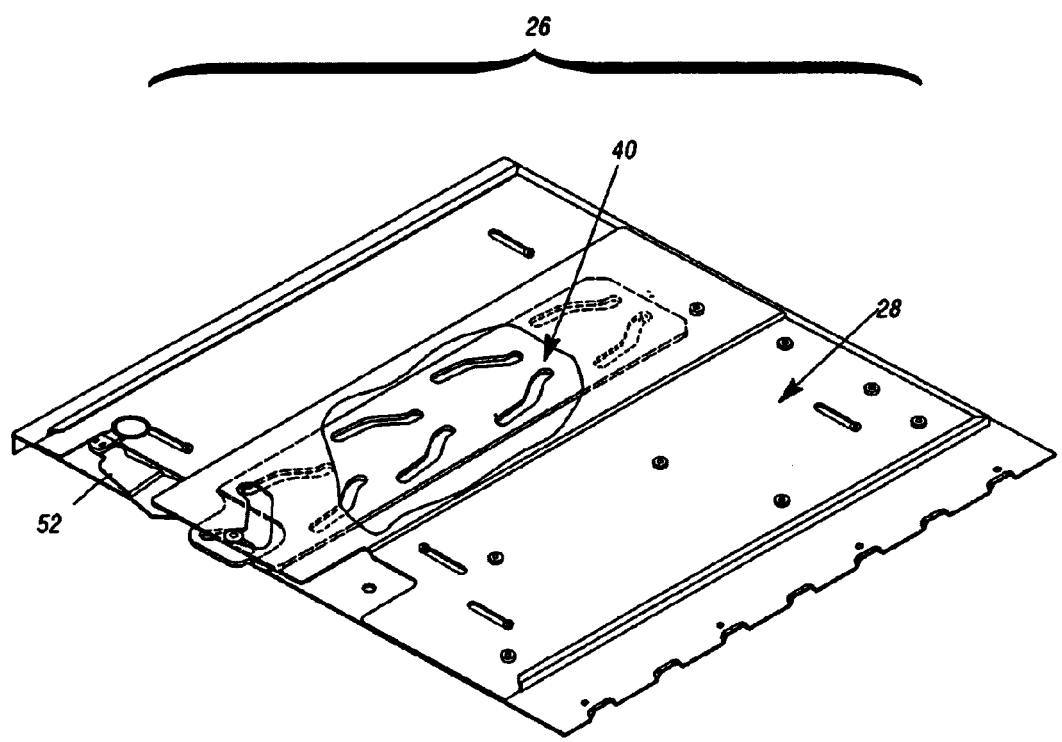
FIG. 10 is a perspective view of the mounting assembly shown in FIG. 4, in the extended position.

Referring to FIGS. 9 and 10, the mounting assembly is illustrated in its inserted and extracted positions, respectively. The controlled motion of the cam body 40, lever 52, and tray 28 with respect to the shelf 12E of the chassis 12 and with respect to one another is evidenced by the relative positions of the cam followers within the slots and along the cam surfaces.

As shown in the inserted position in FIG. 9, the lever 52 is rotated to the right, the cam body 40 is advanced inwardly along the insertion axis Ai and toward the interior of the chassis 12, and the tray 28 is advanced to the right along the connection axis Ac. In this position, the connector 24 of the circuit assembly 22 is connected to the connector 20 of the side plane 18.

As shown in the extracted position in FIG. 10, the lever 52 is rotated to the left, the cam body 40 is retracted outwardly along the insertion axis Ai and outwardly from the interior of the chassis 12, and the tray 28 is retracted to the left along the connection axis Ac. In this position, the connector 24 of the circuit assembly 22 is disconnected from the connector 20 of the side plane 18.

Figure 5:
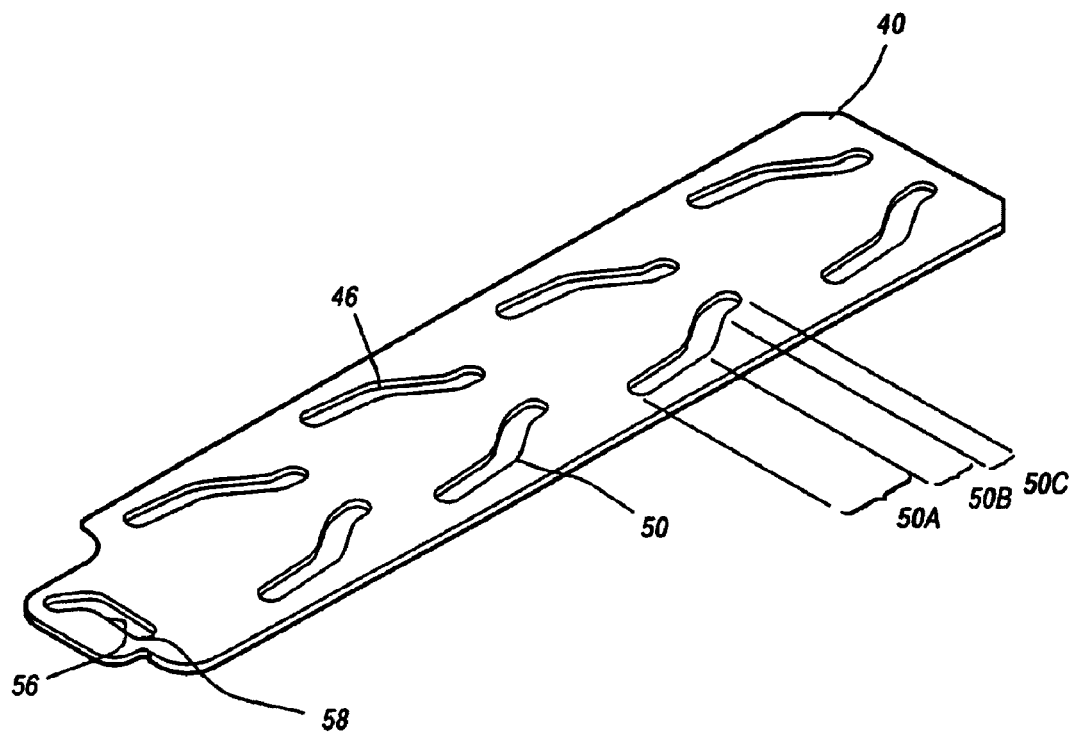
FIG. 5 is a perspective view of an exemplary embodiment of a cam body configured for use in the mounting assembly shown in FIG. 4.

Referring now to FIG. 5, an exemplary cam body 40 is illustrated. As is indicated in FIG. 5, each cam surface 44 and 50 can be divided into three segments. In the example of cam surface 50, each such surface has a first portion 50A, a second portion SOB, and a third portion SOC. The first portion 50A is elongated and oriented at a slight angle with respect to the insertion axis Ai. The second portion SOB is oriented at a slightly greater angle with respect to the insertion axis Ai. The contours (angles and lengths, for example) of first and second portions 50A and 50B of cam surface 50 characterize the manner in which force is transferred from pivotal movement of the lever 52 with respect to the chassis 12 to the axial movement of the tray 28 along the connection axis Ac. In other words, the angles of various portions of the cam surface 50 will help determine the forces and relative speeds of the components that are moving with respect to one another upon the actuation of the lever 52. The portion 50C of the cam surface 50 is generally parallel to the insertion axis Ai, thereby providing a temporary lock of the cam body 40 by virtue of engagement between the cam followers 42 and 48 adjacent cam surfaces 44 and 50.

Though exemplary embodiments of cam surfaces 44 and 50 are illustrated in the figures, the actual shapes, configurations, and orientations of cam surfaces can be varied and modified in order to arrive at any desired parameters (e.g., force translation, relative speed of motion between cam components, and other parameters specific to particular applications of this invention).

Referring now to FIG. 6, one exemplary embodiment of a tray 28 is illustrated. In FIG. 6, the flanges 30 extend almost the full length of the tray 28, thereby providing support for the printed circuit assembly 22 along substantially its full length. The moving tray 28 is contoured in the areas proximal to clearance opening 60 in order to provide clearance for the lever 52 when it is in the retracted is position or positions (not shown).

The tray 28, like the cam body 40, can be formed from any material. In an exemplary embodiment, the cam body 40 and moving tray 28 are formed from sheet metal that can be bent to create the form illustrated in FIG. 6 and that can be machined to provide the configuration shown in FIG. 5. Nevertheless, the components can be optionally formed from plastic or other materials.

Figure 7:
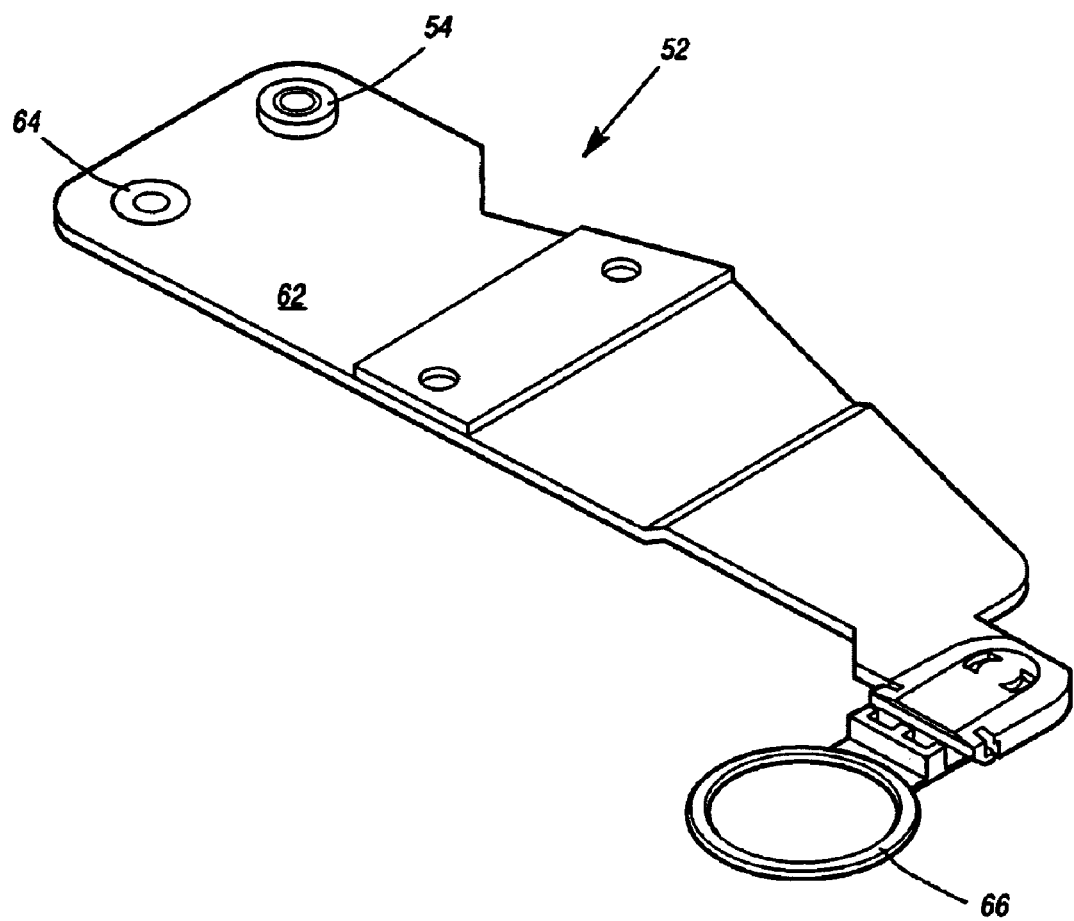
FIG. 7 is a perspective view of an exemplary embodiment of a lever component of the mounting assembly shown in FIG. 4.

Referring to FIG. 7, the lever 52 includes a pivot 64 to define an axis about which the lever 52 rotates with respect to the shelf 12E of the chassis 12. The pivot 64, as well as the cam follower 54, is associated with a body portion 62 of the lever 52. At an opposite end of the body portion 62 from the pivot 64 and the cam follower 54, the lever 52 includes a pull ring 66. The pull ring 66 can be mounted for pivotal movement with respect to the body portion 62 of the lever 52 so that it can be pulled by a user of the computer system 10.

Although the invention is illustrated and described herein with reference to specific embodiments, the invention is not intended to be limited to the details shown. Rather, various modifications may be made in the details within the scope and range of equivalents of the claims and without departing from the invention.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed is:

1. A computer system comprising:
   a chassis at least partially defining an interior and an access opening;
   an interface connector mounted within or adjacent said chassis and oriented to face the interior of said chassis;
   a circuit board assembly configured for insertion into and removal from said interior of said chassis through said access opening and along an insertion axis, said circuit board having a connector oriented for engagement with said interface connector; and
   a mounting assembly positioned to facilitate engagement of said connector of said circuit board assembly to said interface connector along a connection axis angled with respect to said insertion axis, said mounting assembly having:
   a tray mounted for movement with respect to said chassis along said connection axis, said tray being configured to receive said circuit board assembly along said insertion axis; and
   a cam mechanism having a lever configured for rotational movement relative to the chassis, said lever also configured to move a cam body, said cam body configured to move said circuit board assembly relative to said chassis along said connection axis.

2. The computer system recited in claim 1, wherein said connection axis is substantially perpendicular to said insertion axis.

3. The computer system recited in claim 1, said tray defining a channel oriented to slidingly receive said circuit board assembly along said insertion axis.

4. The computer system recited in claim 3, said tray having opposed flanges together defining said channel.

5. The computer system recited in claim 1, further comprising a pin member extending from said chassis or said tray for guided movement with respect to a guide surface of said tray or said chassis.

6. The computer system recited in claim 5, wherein said pin member extends from said chassis and said guide surface is defined by said tray.

7. The computer system recited in claim 5, wherein said guide surface is defined by a slot.

8. The computer system recited in claim 1, wherein said cam body is coupled for movement with respect to said chassis along said insertion axis.

9. The computer system recited in claim 8, said cam mechanism further comprising a cam follower extending from said chassis or said cam body for guided movement with respect to a cam surface of said cam body or said chassis.

10. The computer system recited in claim 9, wherein said cam follower extends from said chassis and said cam surface is defined by said cam body.

11. The computer system recited in claim 9, wherein said cam surface is defined by a slot.

12. A computer system comprising:
a chassis at least partially defining an interior and an access opening;
an interface connector mounted within or adjacent said chassis and oriented to face the interior of said chassis;
a circuit board assembly configured for insertion into and removal from said interior of said chassis through said access opening and along an insertion axis, said circuit board having a connector oriented for engagement with said interface connector; and
a mounting assembly positioned to facilitate engagement of said connector of said circuit board assembly to said interface connector along a connection axis angled with respect to said insertion axis, said mounting assembly having:
a tray mounted for movement with respect to said chassis along said connection axis, said tray being configured to receive said circuit board assembly along said insertion axis; and
a cam mechanism having:
a cam body;
a lever movable with respect to said cam body;
a cam follower extending from said lever or said cam body for guided movement with respect to a cam surface of said cam body or said lever; and
a cam follower extending from said tray or said cam body for guided movement with respect to a cam surface of said cam body or said tray.

13. The computer system recited in claim 12, wherein said cam follower extending from said tray or said cam body extends from said tray and said cam surface of said cam body or said tray is defined by said cam body.

14. The computer system recited in claim 12, wherein said cam follower extending from said lever or said cam body extends from said lever and said cam surface of said cam body or said lever is defined by said cam body.

15. A computer system comprising:
a chassis at least partially defining an interior and an access opening;
an interface connector mounted within or adjacent said chassis and oriented to face the interior of said chassis;
a circuit board assembly configured for insertion into and removal from said interior of said chassis through said access opening and along an insertion axis, said circuit board having a connector oriented for engagement with said interface connector;
a tray engaging said circuit board assembly, said tray being mounted for movement with respect to said chassis along said connection axis, said tray being configured to receive said circuit board assembly along said insertion axis and to move said circuit board assembly relative to said chassis along said connection axis; and
a cam mechanism coupled to said tray and configured to move said tray along said connection axis, said cam mechanism having a cam body coupled for movement with respect to said chassis and a lever coupled for pivotal movement with respect to said chassis and for engagement with said cam body to facilitate movement of said cam body with respect to said chassis, wherein said cam body translates said pivotal movement of said lever to said movement of said tray along said connection axis.

16. The computer system recited in claim 15, wherein said connection axis is substantially perpendicular to said insertion axis.

17. The computer system recited in claim 15, said tray defining a channel oriented to slidingly receive said circuit board assembly along said insertion axis.

18. The computer system recited in claim 17, said tray having opposed flanges together defining said channel.

* * * * *